United States Patent
Raichelgauz et al.

(10) Patent No.: US 10,796,444 B1
(45) Date of Patent: Oct. 6, 2020

(54) CONFIGURING SPANNING ELEMENTS OF A SIGNATURE GENERATOR

(71) Applicant: Cortica LTD, Tel Aviv (IL)

(72) Inventors: Igal Raichelgauz, Tel Aviv (IL); Ruth Bernstein, Tel Aviv (IL)

( * ) Notice: Subject to any disclaimer, the term of this patent is extended or adjusted under 35 U.S.C. 154(b) by 0 days.

(21) Appl. No.: 16/686,154

(22) Filed: Nov. 17, 2019

Related U.S. Application Data

(60) Provisional application No. 62/827,112, filed on Mar. 31, 2019, provisional application No. 62/827,120, filed on Mar. 31, 2019.

(51) Int. Cl.
*G06T 7/70* (2017.01)
*H03L 7/00* (2006.01)
*G01S 13/90* (2006.01)

(52) U.S. Cl.
CPC ............... *G06T 7/70* (2017.01); *G01S 13/90* (2013.01); *H03L 7/00* (2013.01)

(58) Field of Classification Search
None
See application file for complete search history.

(56) References Cited

U.S. PATENT DOCUMENTS

| | | | |
|---|---|---|---|
| 4,733,353 A | 3/1988 | Jaswa | |
| 4,932,645 A | 6/1990 | Schorey et al. | |
| 4,972,363 A | 11/1990 | Nguyen et al. | |
| 5,078,501 A | 1/1992 | Hekker et al. | |
| 5,214,746 A | 5/1993 | Fogel et al. | |
| 5,307,451 A | 4/1994 | Clark | |
| 5,412,564 A | 5/1995 | Ecer | |
| 5,436,653 A | 7/1995 | Ellis et al. | |
| 5,568,181 A | 10/1996 | Greenwood et al. | |
| 5,638,425 A | 6/1997 | Meador, I et al. | |
| 5,745,678 A | 4/1998 | Herzberg et al. | |
| 5,754,938 A | 5/1998 | Herz et al. | |
| 5,763,069 A | 6/1998 | Jordan | |
| 5,806,061 A | 9/1998 | Chaudhuri et al. | |
| 5,835,087 A | 11/1998 | Herz et al. | |
| 5,835,901 A | 11/1998 | Duvoisin et al. | |
| 5,852,435 A | 12/1998 | Vigneaux et al. | |
| 5,870,754 A | 2/1999 | Dimitrova et al. | |
| 5,873,080 A | 2/1999 | Coden et al. | |
| 5,887,193 A | 3/1999 | Takahashi et al. | |
| 5,926,812 A | 7/1999 | Hilsenrath et al. | |
| 5,978,754 A | 11/1999 | Kumano | |
| 5,991,306 A | 11/1999 | Burns et al. | |
| 6,052,481 A | 4/2000 | Grajski et al. | |
| 6,070,167 A | 5/2000 | Qian et al. | |

(Continued)

FOREIGN PATENT DOCUMENTS

| EP | 1085464 A3 | 1/2007 |
|---|---|---|
| WO | 0231764 A2 | 4/2002 |

(Continued)

OTHER PUBLICATIONS

"Computer Vision Demonstration Website", Electronics and Computer Science, University of Southampton, 2005, USA.

(Continued)

*Primary Examiner* — Leon Viet Q Nguyen
(74) *Attorney, Agent, or Firm* — Reches Patent

(57) ABSTRACT

Systems, and method and computer readable media that store instructions for calculating signatures, utilizing signatures and the like.

22 Claims, 8 Drawing Sheets

(56) References Cited

U.S. PATENT DOCUMENTS

| | | |
|---|---|---|
| 6,076,088 A | 6/2000 | Paik et al. |
| 6,122,628 A | 9/2000 | Castelli et al. |
| 6,128,651 A | 10/2000 | Cezar |
| 6,137,911 A | 10/2000 | Zhilyaev |
| 6,144,767 A | 11/2000 | Bottou et al. |
| 6,147,636 A | 11/2000 | Gershenson |
| 6,163,510 A | 12/2000 | Lee et al. |
| 6,243,375 B1 | 6/2001 | Speicher |
| 6,243,713 B1 | 6/2001 | Nelson et al. |
| 6,275,599 B1 | 8/2001 | Adler et al. |
| 6,314,419 B1 | 11/2001 | Faisal |
| 6,329,986 B1 | 12/2001 | Cheng |
| 6,381,656 B1 | 4/2002 | Shankman |
| 6,411,229 B2 | 6/2002 | Kobayashi |
| 6,422,617 B1 | 7/2002 | Fukumoto et al. |
| 6,507,672 B1 | 1/2003 | Watkins et al. |
| 6,523,046 B2 | 2/2003 | Liu et al. |
| 6,524,861 B1 | 2/2003 | Anderson |
| 6,546,405 B2 | 4/2003 | Gupta et al. |
| 6,550,018 B1 | 4/2003 | Abonamah et al. |
| 6,557,042 B1 | 4/2003 | He et al. |
| 6,594,699 B1 | 7/2003 | Sahai et al. |
| 6,601,026 B2 | 7/2003 | Appelt et al. |
| 6,611,628 B1 | 8/2003 | Sekiguchi et al. |
| 6,618,711 B1 | 9/2003 | Ananth |
| 6,643,620 B1 | 11/2003 | Contolini et al. |
| 6,643,643 B1 | 11/2003 | Lee et al. |
| 6,665,657 B1 | 12/2003 | Dibachi |
| 6,681,032 B2 | 1/2004 | Bortolussi et al. |
| 6,704,725 B1 | 3/2004 | Lee |
| 6,732,149 B1 | 5/2004 | Kephart |
| 6,742,094 B2 | 5/2004 | Igari |
| 6,751,363 B1 | 6/2004 | Natsev et al. |
| 6,751,613 B1 | 6/2004 | Lee et al. |
| 6,754,435 B2 | 6/2004 | Kim |
| 6,763,069 B1 | 7/2004 | Divakaran et al. |
| 6,763,519 B1 | 7/2004 | McColl et al. |
| 6,774,917 B1 | 8/2004 | Foote et al. |
| 6,795,818 B1 | 9/2004 | Lee |
| 6,804,356 B1 | 10/2004 | Krishnamachari |
| 6,813,395 B1 | 11/2004 | Kinjo |
| 6,819,797 B1 | 11/2004 | Smith et al. |
| 6,877,134 B1 | 4/2005 | Fuller et al. |
| 6,901,207 B1 | 5/2005 | Watkins |
| 6,938,025 B1 | 8/2005 | Lulich et al. |
| 6,943,724 B1 * | 9/2005 | Brace ................ G01S 13/9029 342/175 |
| 6,985,172 B1 | 1/2006 | Rigney et al. |
| 7,013,051 B2 | 3/2006 | Sekiguchi et al. |
| 7,020,654 B1 | 3/2006 | Najmi |
| 7,023,979 B1 | 4/2006 | Wu et al. |
| 7,043,473 B1 | 5/2006 | Rassool et al. |
| 7,158,681 B2 | 1/2007 | Persiantsev |
| 7,215,828 B2 | 5/2007 | Luo |
| 7,260,564 B1 | 8/2007 | Lynn et al. |
| 7,289,643 B2 | 10/2007 | Brunk et al. |
| 7,299,261 B1 | 11/2007 | Oliver et al. |
| 7,302,089 B1 | 11/2007 | Smits |
| 7,302,117 B2 | 11/2007 | Sekiguchi et al. |
| 7,313,805 B1 | 12/2007 | Rosin et al. |
| 7,340,358 B2 | 3/2008 | Yoneyama |
| 7,346,629 B2 | 3/2008 | Kapur et al. |
| 7,353,224 B2 | 4/2008 | Chen et al. |
| 7,376,672 B2 | 5/2008 | Weare |
| 7,383,179 B2 | 6/2008 | Alves et al. |
| 7,433,895 B2 | 10/2008 | Li et al. |
| 7,464,086 B2 | 12/2008 | Black et al. |
| 7,529,659 B2 | 5/2009 | Wold |
| 7,657,100 B2 | 2/2010 | Gokturk et al. |
| 7,660,468 B2 | 2/2010 | Gokturk et al. |
| 7,805,446 B2 | 9/2010 | Potok et al. |
| 7,860,895 B1 | 12/2010 | Scofield et al. |
| 7,872,669 B2 | 1/2011 | Darrell et al. |
| 7,921,288 B1 | 4/2011 | Hildebrand |
| 7,933,407 B2 | 4/2011 | Keidar et al. |
| 8,023,739 B2 | 9/2011 | Hohimer et al. |
| 8,266,185 B2 | 9/2012 | Raichelgauz et al. |
| 8,285,718 B1 | 10/2012 | Ong et al. |
| 8,312,031 B2 | 11/2012 | Raichelgauz et al. |
| 8,315,442 B2 | 11/2012 | Gokturk et al. |
| 8,345,982 B2 | 1/2013 | Gokturk et al. |
| 8,386,400 B2 | 2/2013 | Raichelgauz et al. |
| 8,396,876 B2 | 3/2013 | Kennedy et al. |
| 8,418,206 B2 | 4/2013 | Bryant et al. |
| 8,442,321 B1 | 5/2013 | Chang et al. |
| 8,457,827 B1 | 6/2013 | Ferguson et al. |
| 8,495,489 B1 | 7/2013 | Everingham |
| 8,635,531 B2 | 1/2014 | Graham et al. |
| 8,655,801 B2 | 2/2014 | Raichelgauz et al. |
| 8,655,878 B1 | 2/2014 | Kulkarni et al. |
| 8,799,195 B2 | 8/2014 | Raichelgauz et al. |
| 8,799,196 B2 | 8/2014 | Raichelquaz et al. |
| 8,818,916 B2 | 8/2014 | Raichelgauz et al. |
| 8,868,861 B2 | 10/2014 | Shimizu et al. |
| 8,886,648 B1 | 11/2014 | Procopio et al. |
| 8,954,887 B1 | 2/2015 | Tseng et al. |
| 8,990,199 B1 | 3/2015 | Ramesh et al. |
| 9,009,086 B2 | 4/2015 | Raichelgauz et al. |
| 9,104,747 B2 | 8/2015 | Raichelgauz et al. |
| 9,165,406 B1 | 10/2015 | Gray et al. |
| 9,311,308 B2 | 4/2016 | Sankarasubramaniam et al. |
| 9,323,754 B2 | 4/2016 | Ramanathan et al. |
| 9,466,068 B2 | 10/2016 | Raichelgauz et al. |
| 9,646,006 B2 | 5/2017 | Raichelgauz et al. |
| 9,679,062 B2 | 6/2017 | Schillings et al. |
| 9,807,442 B2 | 10/2017 | Bhatia et al. |
| 9,875,445 B2 | 1/2018 | Amer et al. |
| 9,984,369 B2 | 5/2018 | Li et al. |
| 10,205,457 B1 * | 2/2019 | Josefsberg .............. G01S 7/032 |
| 2001/0019633 A1 | 9/2001 | Tenze et al. |
| 2001/0034219 A1 | 10/2001 | Hewitt et al. |
| 2001/0038876 A1 | 11/2001 | Anderson |
| 2002/0004743 A1 | 1/2002 | Kutaragi et al. |
| 2002/0010682 A1 | 1/2002 | Johnson |
| 2002/0010715 A1 | 1/2002 | Chinn et al. |
| 2002/0019881 A1 | 2/2002 | Bokhari et al. |
| 2002/0032677 A1 | 3/2002 | Morgenthaler et al. |
| 2002/0038299 A1 | 3/2002 | Zernik et al. |
| 2002/0042914 A1 | 4/2002 | Walker et al. |
| 2002/0072935 A1 | 6/2002 | Rowse et al. |
| 2002/0087530 A1 | 7/2002 | Smith et al. |
| 2002/0087828 A1 | 7/2002 | Arimilli et al. |
| 2002/0091947 A1 | 7/2002 | Nakamura |
| 2002/0107827 A1 | 8/2002 | Benitez-Jimenez et al. |
| 2002/0113812 A1 | 8/2002 | Walker et al. |
| 2002/0126002 A1 | 9/2002 | Patchell |
| 2002/0126872 A1 | 9/2002 | Brunk et al. |
| 2002/0129140 A1 | 9/2002 | Peled et al. |
| 2002/0147637 A1 | 10/2002 | Kraft et al. |
| 2002/0157116 A1 | 10/2002 | Jasinschi |
| 2002/0163532 A1 | 11/2002 | Thomas et al. |
| 2002/0174095 A1 | 11/2002 | Lulich et al. |
| 2002/0184505 A1 | 12/2002 | Mihcak et al. |
| 2003/0004966 A1 | 1/2003 | Bolle et al. |
| 2003/0005432 A1 | 1/2003 | Ellis et al. |
| 2003/0037010 A1 | 2/2003 | Schmelzer |
| 2003/0041047 A1 | 2/2003 | Chang et al. |
| 2003/0089216 A1 | 5/2003 | Birmingham et al. |
| 2003/0093790 A1 | 5/2003 | Logan et al. |
| 2003/0101150 A1 | 5/2003 | Agnihotri et al. |
| 2003/0105739 A1 | 6/2003 | Essafi et al. |
| 2003/0110236 A1 | 6/2003 | Yang et al. |
| 2003/0115191 A1 | 6/2003 | Copperman et al. |
| 2003/0126147 A1 | 7/2003 | Essafi et al. |
| 2003/0140257 A1 | 7/2003 | Peterka et al. |
| 2003/0165269 A1 | 9/2003 | Fedorovskaya et al. |
| 2003/0174859 A1 | 9/2003 | Kim |
| 2003/0184598 A1 | 10/2003 | Graham |
| 2003/0200217 A1 | 10/2003 | Ackerman |
| 2003/0217335 A1 | 11/2003 | Chung et al. |
| 2003/0229531 A1 | 12/2003 | Heckerman et al. |
| 2004/0095376 A1 | 5/2004 | Graham et al. |
| 2004/0098671 A1 | 5/2004 | Graham et al. |
| 2004/0111432 A1 | 6/2004 | Adams et al. |

(56) References Cited

U.S. PATENT DOCUMENTS

| | | |
|---|---|---|
| 2004/0117638 A1 | 6/2004 | Monroe |
| 2004/0128511 A1 | 7/2004 | Sun et al. |
| 2004/0153426 A1 | 8/2004 | Nugent |
| 2004/0162820 A1 | 8/2004 | James et al. |
| 2004/0267774 A1 | 12/2004 | Lin et al. |
| 2005/0021394 A1 | 1/2005 | Miedema et al. |
| 2005/0080788 A1 | 4/2005 | Murata |
| 2005/0114198 A1 | 5/2005 | Koningstein et al. |
| 2005/0131884 A1 | 6/2005 | Gross et al. |
| 2005/0163375 A1 | 7/2005 | Grady |
| 2005/0172130 A1 | 8/2005 | Roberts |
| 2005/0177372 A1 | 8/2005 | Wang et al. |
| 2005/0226511 A1 | 10/2005 | Short |
| 2005/0238198 A1 | 10/2005 | Brown et al. |
| 2005/0238238 A1 | 10/2005 | Xu et al. |
| 2005/0249398 A1 | 11/2005 | Khamene et al. |
| 2005/0256820 A1 | 11/2005 | Dugan et al. |
| 2005/0262428 A1 | 11/2005 | Little et al. |
| 2005/0281439 A1 | 12/2005 | Lange |
| 2005/0289163 A1 | 12/2005 | Gordon et al. |
| 2005/0289590 A1 | 12/2005 | Cheok et al. |
| 2006/0004745 A1 | 1/2006 | Kuhn et al. |
| 2006/0015580 A1 | 1/2006 | Gabriel et al. |
| 2006/0020958 A1 | 1/2006 | Allamanche et al. |
| 2006/0033163 A1 | 2/2006 | Chen |
| 2006/0050993 A1 | 3/2006 | Stentiford |
| 2006/0069668 A1 | 3/2006 | Braddy et al. |
| 2006/0080311 A1 | 4/2006 | Potok et al. |
| 2006/0112035 A1 | 5/2006 | Cecchi et al. |
| 2006/0129822 A1 | 6/2006 | Snijder et al. |
| 2006/0217818 A1 | 9/2006 | Fujiwara |
| 2006/0217828 A1 | 9/2006 | Hicken |
| 2006/0218191 A1 | 9/2006 | Gopalakrishnan |
| 2006/0224529 A1 | 10/2006 | Kermani |
| 2006/0236343 A1 | 10/2006 | Chang |
| 2006/0242130 A1 | 10/2006 | Sadri et al. |
| 2006/0248558 A1 | 11/2006 | Barton et al. |
| 2006/0251338 A1 | 11/2006 | Gokturk et al. |
| 2006/0253423 A1 | 11/2006 | McLane et al. |
| 2006/0288002 A1 | 12/2006 | Epstein et al. |
| 2007/0022374 A1 | 1/2007 | Huang et al. |
| 2007/0033170 A1 | 2/2007 | Sull et al. |
| 2007/0038614 A1 | 2/2007 | Guha |
| 2007/0042757 A1 | 2/2007 | Jung et al. |
| 2007/0061302 A1 | 3/2007 | Ramer et al. |
| 2007/0067304 A1 | 3/2007 | Ives |
| 2007/0074147 A1 | 3/2007 | Wold |
| 2007/0083611 A1 | 4/2007 | Farago et al. |
| 2007/0091106 A1 | 4/2007 | Moroney |
| 2007/0130159 A1 | 6/2007 | Gulli et al. |
| 2007/0136782 A1 | 6/2007 | Ramaswamy et al. |
| 2007/0156720 A1 | 7/2007 | Maren |
| 2007/0244902 A1 | 10/2007 | Seide et al. |
| 2007/0253594 A1 | 11/2007 | Lu et al. |
| 2007/0298152 A1 | 12/2007 | Baets |
| 2008/0049789 A1 | 2/2008 | Vedantham et al. |
| 2008/0072256 A1 | 3/2008 | Boicey et al. |
| 2008/0079729 A1 | 4/2008 | Brailovsky |
| 2008/0152231 A1 | 6/2008 | Gokturk et al. |
| 2008/0159622 A1 | 7/2008 | Agnihotri et al. |
| 2008/0165861 A1 | 7/2008 | Wen et al. |
| 2008/0201299 A1 | 8/2008 | Lehikoinen et al. |
| 2008/0201314 A1 | 8/2008 | Smith et al. |
| 2008/0201361 A1 | 8/2008 | Castro et al. |
| 2008/0228995 A1 | 9/2008 | Tan et al. |
| 2008/0237359 A1 | 10/2008 | Silverbrook et al. |
| 2008/0247543 A1 | 10/2008 | Mick et al. |
| 2008/0253737 A1 | 10/2008 | Kimura et al. |
| 2008/0263579 A1 | 10/2008 | Mears et al. |
| 2008/0270373 A1 | 10/2008 | Oostveen et al. |
| 2008/0294278 A1 | 11/2008 | Borgeson et al. |
| 2008/0307454 A1 | 12/2008 | Ahanger et al. |
| 2008/0313140 A1 | 12/2008 | Pereira et al. |
| 2009/0024641 A1 | 1/2009 | Quigley et al. |
| 2009/0037088 A1 | 2/2009 | Taguchi |
| 2009/0043637 A1 | 2/2009 | Eder |
| 2009/0096634 A1 | 4/2009 | Emam et al. |
| 2009/0125544 A1 | 5/2009 | Brindley |
| 2009/0157575 A1 | 6/2009 | Schobben et al. |
| 2009/0165031 A1 | 6/2009 | Li et al. |
| 2009/0172030 A1 | 7/2009 | Schiff et al. |
| 2009/0208106 A1 | 8/2009 | Dunlop et al. |
| 2009/0208118 A1 | 8/2009 | Csurka |
| 2009/0216761 A1 | 8/2009 | Raichelgauz et al. |
| 2009/0220138 A1 | 9/2009 | Zhang et al. |
| 2009/0245573 A1 | 10/2009 | Saptharishi et al. |
| 2009/0254572 A1 | 10/2009 | Redlich et al. |
| 2009/0282218 A1 | 11/2009 | Raichelgauz et al. |
| 2009/0297048 A1 | 12/2009 | Slotine et al. |
| 2010/0042646 A1 | 2/2010 | Raichelgauz et al. |
| 2010/0082684 A1 | 4/2010 | Churchill et al. |
| 2010/0104184 A1 | 4/2010 | Bronstein et al. |
| 2010/0125569 A1 | 5/2010 | Nair et al. |
| 2010/0162405 A1 | 6/2010 | Cook et al. |
| 2010/0191391 A1 | 7/2010 | Zeng |
| 2010/0198626 A1 | 8/2010 | Cho et al. |
| 2010/0212015 A1 | 8/2010 | Jin et al. |
| 2010/0284604 A1 | 11/2010 | Chrysanthakopoulos |
| 2010/0293057 A1 | 11/2010 | Haveliwala et al. |
| 2010/0312736 A1 | 12/2010 | Kello |
| 2010/0318493 A1 | 12/2010 | Wessling |
| 2010/0325138 A1 | 12/2010 | Lee et al. |
| 2010/0325581 A1 | 12/2010 | Finkelstein et al. |
| 2011/0035373 A1 | 2/2011 | Berg et al. |
| 2011/0055585 A1 | 3/2011 | Lee |
| 2011/0164180 A1 | 7/2011 | Lee |
| 2011/0164810 A1 | 7/2011 | Zang et al. |
| 2011/0216209 A1 | 9/2011 | Fredlund et al. |
| 2011/0218946 A1 | 9/2011 | Stern et al. |
| 2011/0276680 A1 | 11/2011 | Rimon |
| 2011/0296315 A1 | 12/2011 | Lin et al. |
| 2012/0131454 A1 | 5/2012 | Shah |
| 2012/0136853 A1 | 5/2012 | Kennedy et al. |
| 2012/0167133 A1 | 6/2012 | Carroll et al. |
| 2012/0179642 A1 | 7/2012 | Sweeney et al. |
| 2012/0185445 A1 | 7/2012 | Borden et al. |
| 2012/0207346 A1 | 8/2012 | Kohli et al. |
| 2012/0221470 A1 | 8/2012 | Lyon |
| 2012/0227074 A1 | 9/2012 | Hill et al. |
| 2012/0239690 A1 | 9/2012 | Asikainen et al. |
| 2012/0239694 A1 | 9/2012 | Avner et al. |
| 2012/0265735 A1 | 10/2012 | McMillan et al. |
| 2012/0294514 A1 | 11/2012 | Saunders et al. |
| 2012/0299961 A1 | 11/2012 | Ramkumar et al. |
| 2012/0301105 A1 | 11/2012 | Rehg et al. |
| 2012/0331011 A1 | 12/2012 | Raichelgauz et al. |
| 2013/0043990 A1 | 2/2013 | Al-Jafar |
| 2013/0066856 A1 | 3/2013 | Ong et al. |
| 2013/0067364 A1 | 3/2013 | Berntson et al. |
| 2013/0086499 A1 | 4/2013 | Dyor et al. |
| 2013/0089248 A1 | 4/2013 | Remiszewski et al. |
| 2013/0151522 A1 | 6/2013 | Aggarwal et al. |
| 2013/0159298 A1 | 6/2013 | Mason et al. |
| 2013/0226930 A1 | 8/2013 | Amgren et al. |
| 2013/0227023 A1 | 8/2013 | Raichelgauz et al. |
| 2013/0283401 A1 | 10/2013 | Pabla et al. |
| 2013/0346412 A1 | 12/2013 | Raichelgauz et al. |
| 2014/0019264 A1 | 1/2014 | Wachman et al. |
| 2014/0025692 A1 | 1/2014 | Pappas |
| 2014/0125703 A1 | 5/2014 | Roveta et al. |
| 2014/0147829 A1 | 5/2014 | Jerauld |
| 2014/0149918 A1 | 5/2014 | Asokan et al. |
| 2014/0152698 A1 | 6/2014 | Kim et al. |
| 2014/0156691 A1 | 6/2014 | Conwell |
| 2014/0169681 A1 | 6/2014 | Drake |
| 2014/0176604 A1 | 6/2014 | Venkitaraman et al. |
| 2014/0193077 A1 | 7/2014 | Shiiyama et al. |
| 2014/0198986 A1 | 7/2014 | Marchesotti |
| 2014/0201330 A1 | 7/2014 | Lopez et al. |
| 2014/0250032 A1 | 9/2014 | Huang et al. |
| 2014/0282655 A1 | 9/2014 | Roberts |
| 2014/0300722 A1 | 10/2014 | Garcia |
| 2014/0330830 A1 | 11/2014 | Raichelgauz et al. |
| 2014/0341476 A1 | 11/2014 | Kulick et al. |

(56) References Cited

U.S. PATENT DOCUMENTS

| | | |
|---|---|---|
| 2014/0363044 A1 | 12/2014 | Williams et al. |
| 2015/0052089 A1 | 2/2015 | Kozloski et al. |
| 2015/0100562 A1 | 4/2015 | Kohlmeier et al. |
| 2015/0117784 A1 | 4/2015 | Lin et al. |
| 2015/0120627 A1 | 4/2015 | Hunzinger et al. |
| 2015/0127516 A1 | 5/2015 | Studnitzer et al. |
| 2015/0248586 A1 | 9/2015 | Gaidon et al. |
| 2015/0254344 A1 | 9/2015 | Kulkarni et al. |
| 2015/0286742 A1 | 10/2015 | Zhang et al. |
| 2015/0286872 A1 | 10/2015 | Medioni et al. |
| 2015/0324356 A1 | 11/2015 | Gutierrez et al. |
| 2015/0332588 A1 | 11/2015 | Bulan et al. |
| 2016/0007083 A1 | 1/2016 | Gurha |
| 2016/0026707 A1 | 1/2016 | Ong et al. |
| 2016/0132194 A1 | 5/2016 | Grue et al. |
| 2016/0221592 A1 | 8/2016 | Puttagunta et al. |
| 2016/0275766 A1 | 9/2016 | Venetianer et al. |
| 2016/0306798 A1 | 10/2016 | Guo et al. |
| 2017/0017638 A1 | 1/2017 | Satyavarta et al. |
| 2017/0154241 A1 | 6/2017 | Shambik et al. |
| 2018/0108258 A1 | 4/2018 | Dilger |
| 2018/0157903 A1 | 6/2018 | Tu et al. |
| 2018/0189613 A1 | 7/2018 | Wolf et al. |
| 2018/0373929 A1 | 12/2018 | Ye |
| 2019/0096135 A1 | 3/2019 | Mutto et al. |
| 2019/0171912 A1 | 6/2019 | Vallespi-Gonzalez et al. |
| 2019/0279046 A1 | 9/2019 | Han et al. |
| 2019/0304102 A1 | 10/2019 | Chen et al. |

FOREIGN PATENT DOCUMENTS

| | | | |
|---|---|---|---|
| WO | 2003067467 A1 | 8/2003 | |
| WO | 2005027457 A1 | 3/2005 | |
| WO | 2007049282 A2 | 5/2007 | |
| WO | 2014076002 A1 | 5/2014 | |
| WO | 2014137337 A1 | 9/2014 | |
| WO | 2016040376 A1 | 3/2016 | |
| WO | 2016070193 A1 | 5/2016 | |

OTHER PUBLICATIONS

Big Bang Theory Series 04 Episode 12, aired Jan. 6, 2011; [retrieved from Internet: ].

Boari et al, "Adaptive Routing for Dynamic Applications in Massively Parallel Architectures", 1995 IEEE, Spring 1995, pp. 1-14.

Burgsteiner et al., "Movement Prediction from Real-World Images Using a Liquid State machine", Innovations in Applied Artificial Intelligence Lecture Notes in Computer Science, Lecture Notes in Artificial Intelligence, LNCS, Springer-Verlag, BE, vol. 3533, Jun. 2005, pp. 121-130.

Cernansky et al, "Feed-forward Echo State Networks", Proceedings of International Joint Conference on Neural Networks, Montreal, Canada, Jul. 31-Aug. 4, 2005, pp. 1-4.

Chinchor, Nancy A. et al.; Multimedia Analysis + Visual Analytics = Multimedia Analytics; IEEE Computer Society; 2010; pp. 52-60. (Year: 2010).

Fathy et al, "A Parallel Design and Implementation for Backpropagation Neural Network Using MIMD Architecture", 8th Mediterranean Electrotechnical Conference, 19'96. MELECON '96, Date of Conference: May 13-16, 1996, vol. 3 pp. 1472-1475, vol. 3.

Freisleben et al, "Recognition of Fractal Images Using a Neural Network", Lecture Notes in Computer Science, 1993, vol. 6861, 1993, pp. 631-637.

Garcia, "Solving the Weighted Region Least Cost Path Problem Using Transputers", Naval Postgraduate School, Monterey, California, Dec. 1989.

Guo et al, AdOn: An Intelligent Overlay Video Advertising System (Year: 2009).

Rogue, "Tree Pattern Inference and Matching for Wrapper Induction on the World Wide Web", Master's Thesis, Massachusetts Institute of Technology, Jun. 2004, pp. 1-106.

Hua et al., "Robust Video Signature Based on Ordinal Measure", Image Processing, 2004, 2004 International Conference on Image Processing (ICIP), vol. 1, IEEE, pp. 685-688, 2004.

International Search Report and Written Opinion for PCT/US2016/050471, ISA/RU, Moscow, RU, dated May 4, 2017.

International Search Report and Written Opinion for PCT/US2016/054634, ISA/RU, Moscow, RU, dated Mar. 16, 2017.

International Search Report and Written Opinion for PCT/US2017/015831, ISA/RU, Moscow, RU, dated Apr. 20, 2017.

Lau et al., "Semantic Web Service Adaptation Model for a Pervasive Learning Scenario", 2008 IEEE Conference on Innovative Technologies in Intelligent Systems and Industrial Applications, 2008, pp. 98-103.

Li et al ("Matching Commercial Clips from TV Streams Using a Unique, Robust and Compact Signature" 2005) (Year: 2005).

Lin et al., "Generating robust digital signature for image/video authentication", Multimedia and Security Workshop at ACM Multimedia '98, Bristol, U.K., Sep. 1998, pp. 245-251.

Lu et al, "Structural Digital Signature for Image Authentication: An Incidental Distortion Resistant Scheme", IEEE Transactions on Multimedia, vol. 5, No. 2, Jun. 2003, pp. 161-173.

Lyon, "Computational Models of Neural Auditory Processing", IEEE International Conference on Acoustics, Speech, and Signal Processing, ICASSP '84, Date of Conference: Mar. 1984, vol. 9, pp. 41-44.

Ma Et El "Semantics modeling based image retrieval system using neural networks", 2005.

Marian Stewart B et al., "Independent component representations for face recognition", Proceedings of the SPIE Symposium on Electronic Imaging: Science and Technology; Conference on Human Vision and Electronic Imaging III, San Jose, California, Jan. 1998, pp. 1-12.

May et al, "The Transputer", Springer-Verlag Berlin Heidelberg 1989, vol. 41.

Morad et al., "Performance, Power Efficiency and Scalability of Asymmetric Cluster Chip Multiprocessors", Computer Architecture Letters, vol. 4, Jul. 4, 2005, pp. 1-4, XP002466254.

Nagy et al, "A Transputer, Based, Flexible, Real-Time Control System for Robotic Manipulators", UKACC International Conference on Control '96, Sep. 2-5, 1996, Conference Publication No. 427, IEE 1996.

Natschlager et al., "The "Liquid Computer": A novel strategy for real-time computing on time series", Special Issue on Foundations of Information Processing of telematik, vol. 8, No. 1, 2002, pp. 39-43, XP002466253.

Odinaev et al, "Cliques in Neural Ensembles as Perception Carriers", Technion—Institute of Technology, 2006 International Joint Conference on neural Networks, Canada, 2006, pp. 285-292.

Ortiz-Boyer et al, "CIXL2: A Crossover Operator for Evolutionary Algorithms Based on Population Features", Journal of Artificial Intelligence Research 24 (2005) Submitted Nov. 2004; published Jul. 2005, pp. 1-48.

Pandya etal. A Survey on QR Codes: in context of Research and Application. International Journal of Emerging Technology and U Advanced Engineering. ISSN 2250-2459, ISO 9001:2008 Certified Journal, vol. 4, Issue 3, Mar. 2014 (Year: 2014).

Queluz, "Content-Based Integrity Protection of Digital Images", SPIE Conf. on Security and Watermarking of Multimedia Contents, San Jose, Jan. 1999, pp. 85-93.

Rui, Yong et al. "Relevance feedback: a power tool for interactive content-based image retrieval." IEEE Transactions on circuits and systems for video technology 8.5 (1998): 644-655.

Santos et al., "SCORM-MPEG: an Ontology of Interoperable Metadata for multimediaand E-Learning", 23rd International Conference on Software, Telecommunications and Computer Networks (SoftCom), 2015, pp. 224-228.

Scheper et al, "Nonlinear dynamics in neural computation", ESANN'2006 proceedings—European Symposium on Artificial Neural Networks, Bruges (Belgium), Apr. 26-28, 2006, d-side publication, ISBN 2-930307-06-4, pp. 1-12.

Schneider et al, "A Robust Content based Digital Signature for Image Authentication", Proc. ICIP 1996, Lausane, Switzerland, Oct. 1996, pp. 227-230.

(56) References Cited

OTHER PUBLICATIONS

Srihari et al., "Intelligent Indexing and Semantic Retrieval of Multimodal Documents", Kluwer Academic Publishers, May 2000, vol. 2, Issue 2-3, pp. 245-275.
Srihari, Rohini K. "Automatic indexing and content-based retrieval of captioned images" Computer 0 (1995): 49-56.
Stolberg et al ("HIBRID-SOC: A Multi-Core SOC Architecture for Multimedia Signal Processing" 2003).
Stolberg et al, "HIBRID-SOC: A MUL TI-Core SOC Architecture for MUL TIMEDIA Signal Processing", 2003 IEEE, pp. 189-194.
Theodoropoulos et al, "Simulating Asynchronous Architectures on Transputer Networks", Proceedings of the Fourth Euromicro Workshop on Parallel and Distributed Processing, 1996. PDP '96, pp. 274-281.
Vallet et al ("Personalized Content Retrieval in Context Using Ontological Knowledge" Mar. 2007) (Year: 2007).
Verstraeten et al, "Isolated word recognition with the Liquid State Machine: a case study", Department of Electronics and Information Systems, Ghent University, Sint-Pietersnieuwstraat 41, 9000 Gent, Belgium, Available onlline Jul. 14, 2005, pp. 521-528.
Ware et al, "Locating and Identifying Components in a Robot's Workspace using a Hybrid Computer Architecture" Proceedings of the 1995 IEEE International Symposium on Intelligent Control, Aug. 27-29, 1995, pp. 139-144.
Whitby-Strevens, "The transputer", 1985 IEEE, pp. 292-300.
Yanagawa et al, "Columbia University's Baseline Detectors for 374 LSCOM Semantic Visual Concepts", Columbia University Advent Technical Report # 222-2006-8, Mar. 20, 2007, pp. 1-17.
Yanagawa et al., "Columbia University's Baseline Detectors for 374 LSCOM Semantic Visual Concepts", Columbia University Advent Technical Report #222, 2007, pp. 2006-2008.
Zhou et al, "Ensembling neural networks: Many could be better than all", National Laboratory for Novel Software Technology, Nanjing University, Hankou Road 22, Nanjing 210093, PR China Received Nov. 16, 2001, Available online Mar. 2002, pp. 239-263.
Zhou et al, "Medical Diagnosis With C4.5 Rule Preceded by Artificial Neural Network Ensemble", IEEE Transactions on Information Technology in Biomedicine, vol. 7, Issue: 1, Mar. 2003, pp. 37-42.
Zhu et al., "Technology-Assisted Dietary Assesment", Proc SPIE. Mar. 20, 2008, pp. 1-15.
Zou et al., "A Content-Based Image Authentication System with Lossless Data Hiding", ICME 2003, pp. 213-216.
Lin et al., "Summarization of Large Scale Social Network Activity", DOI: 10.1109/ICASSP.2009.4960375, Apr. 2009, pp. 3481-3484.
Santos et al., "SCORM-MPEG: an ontology of interoperable metadata for Multimedia and e-Learning", DOI: 10.1109/SOFTCOM.2015.7314122, Nov. 2, 2015, pp. 5.
Scheper et al., "Nonlinear dynamics in neural computation", ESANN, 14th European Symposium on Artificial Neural Networks, Jan. 2006, pp. 491-502.
Schneider et al., "A Robust Content Based Digital Signature for Image Authentication", 3rd IEEE International Conference on Image Processing, Sep. 19, 2006, pp. 227-230.
Semizarov et al.,"Specificity of short interfering RNA determined through gene expression signatures", PNAS vol. 100 (11), May 27, 2003, pp. 6347-6352.
Sheng Hua et al., "Robust video signature based on ordinal measure", ICIP '04. 2004 International Conference on Image Processing, Oct. 2004, pp. 685-688.
Stolberg et al., "HiBRID-SoC: A multi-core SoC architecture for multimedia signal processing. VLSI Signal Processing", Journal of VLSI Signal Processing vol. 41(1), Aug. 2005, pp. 9-20.
Theodoropoulos et al., "Simulating asynchronous architectures on transputer networks", 4th Euromicro Workshop on Parallel and Distributed Processing, Braga, Portugal, 1996, pp. 274-281.
Vailaya et al., "Content-Based Hierarchical Classification of Vacation Images", International Conference on Multimedia Computing and Systems, vol. 1, DOI—10.1109/MMCS.1999.779255, Jul. 1999, pp. 518-523.
Verstraeten et al., "Isolated word recognition with the Liquid State Machine: A case study", Information Processing Letters, vol. 95(6), Sep. 2005, pp. 521-528.
Vallet et al.,"Personalized Content Retrieval in Context Using Ontological Knowledge", in IEEE Transactions on Circuits and Systems for Video Technology, vol. 17, No. 3, Mar. 2007, pp. 336-346.
Wang et al., "Classifying objectionable websites based on image content" Interactive Distributed Multimedia Systems and Telecommunication Services, vol. 1483, 1998, pp. 113-124.
Wang et al., "A Signature for Content-Based Image Retrieval Using a Geometrical Transform", 6th ACM International Conference on Multimedia, Multimedia 1998, pp. 229-234.
Ware et al., "Locating and identifying components in a robot's workspace using a hybrid computer architecture", 10th International Symposium on Intelligent Control, 1995, pp. 139-144.
Li et al. "Exploring Visual and Motion Saliency for Automatic Video Object Extraction", in IEEE Transactions on Image Processing, vol. 22, No. 7, Jul. 2013, pp. 2600-2610.
Colin Whitby-Strevens, "The transputer", 12th annual international symposium on Computer architecture (ISCA), IEEE Computer Society Press, Jun. 1985, pp. 292-300.
Wilk et al., "The potential of social-aware multimedia prefetching on mobile devices", International Conference and Workshops on Networked Systems (NetSys 2015) Mar. 2015, p. 1.
Andrew William Hogue, "Tree pattern inference and matching for wrapper induction on the World Wide Web", May 13, 2014, pp. 106.
Liu et al. "Instant Mobile Video Search With Layered Audio-Video Indexing and Progressive Transmission", IEEE Transactions on Multimedia 16(Dec. 8, 2014, pp. 2242-2255.
Raichelgauz et al., "Natural Signal Classification by Neural Cliques and Phase-Locked Attractors", International Conference of the IEEE Engineering in Medicine and Biology Society, 2006, pp. 6693-6697.
Lin et al., "Robust digital signature for multimedia authentication", IEEE Circuits and Systems Magazine, vol. 3, No. 4, 2003, pp. 23-26.
Zang et al., "A New Multimedia Message Customizing Framework for mobile Devices", IEEE International Conference on Multimedia and Expo, 2007, pp. 1043-1046.
Zhou et al., "Ensembling neural networks: Many could be better than all", Artificial Intelligence, vol. 137, 2002, pp. 239-263.
Zhou et al., "Medical diagnosis with C4.5 rule preceded by artificial neural network ensemble", IEEE Transactions on Information Technology in Biomedicine, vol. 7, No. 1, Mar. 2003, pp. 37-42.
Zhu et al., "Technology-Assisted Dietary Assessment", SPIE. 6814. 681411, 2008, p. 1.
Zou et al., "A content-based image authentication system with lossless data hiding", International Conference on Multimedia and Expo. ICME, 2003, pp. II(213)-II(216).
Akira et al., "Columbia University's Baseline Detectors for 374 LSCOM Semantic Visual Concepts", Columbia University Advent Technical Report #222-2006-8, Mar. 20, 2007, pp. 17.
Amparo et al., "Real Time Speaker Localization and Detection System for Camera Steering in Multiparticipant Videoconferencing Environments", IEEE International Conference on Acoustics, Speech and Signal Processing 2011,pp. 2592-2595.
Boari et al., "Adaptive Routing for Dynamic Applications in Massively Parallel Architectures", IEEE Parallel & Distributed Technology: Systems & Applications (vol. 3, Issue: 1, Spring 1995), pp. 61-74.
Boyer et al., "A Crossover Operator for Evolutionary Algorithms Based on Population Features", Journal of Artificial Intelligence Research vol. 24 (2005) pp. 1-48.
Brecheisen et al., ""Hierarchical Genre Classification for Large Music Collections"" , IEEE International Conference on Multimedia and Expo (ICME) 2006, pp. 1385-1388.
Burgsteiner et al., "Movement prediction from real-world images using a liquid state machine" ,International Conference on Industrial, Engineering and Other Applications of Applied Intelligent Systems IEA/AIE 2005: Innovations in Applied Artificial Intelligence, pp. 121-130.

(56) References Cited

OTHER PUBLICATIONS

Cernansky et al., "Feed-forward echo state networks", IEEE International Joint Conference on Neural Networks, 2005, vol. 3, pp. 1479-1482.

Chang et al., "VideoQ: a fully automated video retrieval system using motion sketches", Fourth IEEE Workshop on Applications of Computer Vision. WACV'98 (Cat. No. 98EX201), Oct. 19-21, 1998, pp. 270-271.

Cho et al.,"Efficient Motion-Vector-Based Video Search Using Query by Clip", IEEE International Conference on Multimedia and Expo (ICME) (IEEE Cat. No. 04TH8763), Year: 2004, vol. 2, pp. 1027-1030.

Clement et al."Speaker diarization of heterogeneous web video files: A preliminary study", IEEE International Conference on Acoustics, Speech and Signal Processing (ICASSP),May 22-27, 2011 pp. 4432-4435.

Cococcioni et al., "Automatic diagnosis of defects of rolling element bearings based on computational intelligence techniques", Ninth International Conference on Intelligent Systems Design and Applications, Nov. 30-Dec. 2, 2009, pp. 970-975.

Emami et al., "Role of Spatiotemporal Oriented Energy Features for Robust Visual Tracking in Video Surveillance", IEEE Ninth International Conference on Advanced Video and Signal-Based Surveillance Sep. 18-21, 2012, pp. 349-354.

Fathy et al., "A parallel design and implementation for backpropagation neural network using MIMD architecture", 8th Mediterranean Electrotechnical Conference on Industrial Applications in Power Systems, Computer Science and Telecommunications (MELECON 96) ,May 16, 1996,1472-1476.

Foote et al.,"Content-based retrieval of music and audio", Multimedia Storage and Archiving Systems II, Published in SPIE Proceedings vol. 3229, Oct. 6, 1997, p. 1.

Freisleben et al., "Recognition of fractal images using a neural network",New Trends in Neural Computation, International Workshop on Artificial Neural Networks, IWANN '93 Sitges, Spain, Jun. 9-11, 1993: , pp. 632-637.

Ivan Garcia, "Solving the Weighted Region Least Cost Path Problem Using Transputers", Naval Postgraduate School Monterey, California ,1989 pp. 73.

Gomes et al., "Audio Watermarking and Fingerprinting: For Which Applications?", Journal of New Music Research 32(1) Mar. 2003 p. 1.

Gong et al., "A Knowledge-Based Mediator for Dynamic Integration of Heterogeneous Multimedia Information Sources", International Symposium on Intelligent Multimedia, Video and Speech Processing, Oct. 20-22, 2004, pp. 467-470.

Guo et al., "AdOn: An Intelligent Overlay Video Advertising System", https://doi.org/10.1145/1571941.1572049, Jul. 2009, pp. 628-629.

Howlett et al., "A Multi-Computer Neural Network Architecture in a Virtual Sensor System Application", International Journal of Knowledge-Based and Intelligent Engineering Systems, vol. 4, Published—Apr. 2000 pp. 86-93.

Hua et al., "Robust Video Signature Based on Ordinal Measure", International Conference on Image Processing ICIP '04. 2004, Oct. 24-27, 2004, pp. 5.

Iwamoto et al, "Image Signature Robust to Caption Superimposition for Video Sequence Identification", 2006 International Conference on Image Processing ,IEEE, Atlanta, GA, Oct. 8-11, 2006, pp. 3185-3188.

Herbert Jaeger, "The"echo state" approach to analysing and training recurrent neural networks", Bonn, Germany: German National Research Center for Information Technology GMD Technical Report, 148 ,2001, pp. 43.

Jianping Fan et al., "Concept-Oriented Indexing of Video Databases: Toward Semantic Sensitive Retrieval and Browsing", IEEE Transactions on Image Processing, vol. 13, No. 7, Jul. 2004, p. 1. John L. Johnson., Pulse-coupled neural nets: translation, rotation, scale, distortion, and intensity signal invariance for images, vol. 33, No. 26, Applied Optics, Sep. 10, 1994, pp. 6239-6253.

Odinaev et al., "Cliques in Neural Ensembles as Perception Carriers", 2006 International Joint Conference on Neural Networks Sheraton Vancouver Wail Centre Hotel, Vancouver, BC, Canada Jul. 16-21, 2006, pp. 285-292.

Kabary et al., "SportSense: Using Motion Queries to Find Scenes in Sports Videos", DOI: 10.1145/2505515.2508211, Oct. 2013, pp. 2489-2491.

Keiji Yanai., "Generic Image Classification Using Visual Knowledge on the Web", DOI: 10.1145/957013.957047, Jan. 2003, pp. 167-176.

Lau et al., "Semantic Web Service Adaptation Model for a Pervasive Learning Scenario", Proceedings of the 2008 IEEE Conference on innovative Technologies in Intelligent Systems and Industrial Applications Multimedia University, Cyberjaya, Malaysia. Jul. 12-13, 2008, pp. 98-103.

Li et al., "Matching Commercial Clips from TV Streams Using a Unique, Robust and Compact Signature", DOI: 10.1109/DICTA. 2005.52, Jan. 2006, pp. 7.

Lin et al., "Generating Robust Digital Signature for Image/Video Authentication", Multimedia and Security Workshop at ACM Multimedia '98. Bristol. U.K., Sep. 1998, pp. 49-54.

Löytynoja et al., "Audio Encryption Using Fragile Watermarking", DOI: 10.1109/ICICS.2005.1689175, Jul. 2015, pp. 881-885.

Richard F. Lyon., "Computational Models of Neural Auditory Processing", DOI: 10.1109/ICASSP.1984.1172756, ICASSP '84. IEEE International Conference on Acoustics, Speech, and Signal Processing, Jan. 29, 2003, pp. 5.

Maass et al., "Computational Models for Generic Cortical Microcircuits", DOI: 10.1201/9780203494462.ch18, Jun. 10, 2003, pp. 1-26.

Mandhaoui et al., "Emotional speech characterization based on multi-features fusion for face-to-face interaction", 2009 International conference on signals, circuits and systems ,DOI: 10.1109/ICSCS.2009.5412691, Dec. 2009, pp. 1-6.

May et al., "The Transputer", Neural Computers. Springer Study Edition, vol. 41. Springer, Berlin, Heidelberg, DOI: 10.1007/978-3-642-83740-1_48, Jan. 1989 pp. 477-486.

McNamara et al., "Diversity Decay in Opportunistic Content Sharing Systems", DOI: 10.1109/WoWMoM.2011.5986211 2011 IEEE International Symposium on a World of Wireless, Mobile and Multimedia Networks Aug. 15, 2011, pp. 1-3.

Mei et al., "Contextual in-image Advertising",MM'OS, Oct. 26-31, 2008. Vancouver, British Columbia, Canada. Copyright 2008 ACM 978-1-60558-303-7/08/10, DOI: 10.1145/1459359.1459418• Source: DBLP, Jan. 2008, pp. 439-448.

Mei et al., "VideoSense—Towards Effective Online Video Advertising", MM'07, Sep. 23-28, 2007, Augsburg, Bavaria, Germany. Copyright 2007 ACM 978-1-59593-701-8/07/0009 . . . $5.00, Jan. 2007, pp. 1075-1084.

Mladenovic et al., "Electronic Tour Guide for Android Mobile Platform with Multimedia Travel Book" 20th Telecommunications forum TELFOR 2012, DOI: 10.1109/TELFOR.2012.6419494, Nov. 20-22, 2012, pp. 1460-1463.

Morad et al., "Performance, Power Efficiency and Scalability of Asymmetric Cluster Chip Multiprocessors", IEEE Computer Architecture Letters, vol. 5, 2006, DOI 10.1109/L-CA.2006.6, Jul. 5, 2006, pp. 4.

Nagy et al., "A Transputer Based, Flexible, Real-Time Control System for Robotic Manipulators", UKACC International Conference on Control '96, Conference Publication No. 427 © IEE 1996, Sep. 2-5, 1996, pp. 84-89.

Nam et al., "Audio-Visual Content-Based Violent Scene Characterization", Proceedings 1998 International Conference on Image Processing. ICIP98 (Cat. No. 98CB36269), DOI: 10.1109/ICIP. 1998.723496, pp. 353-357.

Natschläger et al., "The "Liquid Computer": A Novel Strategy for Real-Time Computing on Time Series", Jan. 2002, pp. 1-7.

Nouza et al., "Large-Scale Processing, Indexing and Search System for Czech Audio-Visual Cultural Heritage Archives", DOI: 10.1109/MMSP.2012.6343465, Sep. 2012, pp. 337-342.

Odinaev., "Cliques to Neural Ensembles as Perception Carriers", 2006 International Joint Conference on Neural Networks Sheraton

(56) References Cited

OTHER PUBLICATIONS

Vancouver Wail Centre Hotel, Vancouver, BC, Canada, DOI: 10.1109/IJCNN.2006.246693, Jul. 16-21, 2006, pp. 285-292.

Park et al., "Compact Video Signatures for Near-Duplicate Detection on Mobile Devices", DOI: 10.1109/ISCE.2014.6884293, Jun. 2014, pp. 1-2.

Maria Paula Queluz., "Content-based integrity protection of digital images", San Jose. California •Jan. 1999 SPIE vol. 3657 •0277-786X/99/$10.00, DOI: 10.1117/12.344706, Apr. 1999, pp. 85-93.

Raichelgauz et al., "Co-evoletiooary Learning in Liquid Architectures", DOI: 10.1007/11494669_30, Jun. 2005, pp. 241-248.

\* cited by examiner

CONFIGURING SPANNING ELEMENTS OF A SIGNATURE GENERATOR

CROSS REFERENCE

This application claims priority from U.S. provisional patent 62/827,120 filing date Mar. 31, 2019.

BACKGROUND

Object detection has extensive usage in variety of applications, starting from security, sport events, automatic vehicles, and the like.

Vast amounts of media units are processed during object detection and their processing may require vast amounts of computational resources and memory resources.

Furthermore—many object detection process are sensitive to various acquisition parameters such as angle of acquisition, scale, and the like.

There is a growing need to provide robust and efficient object detection methods.

SUMMARY

There may be provided systems, methods and computer readable medium as illustrated in the specification.

There may be provided a method for configuring spanning elements of a signature generator, the method may include receiving test sensed information units; generating representations of the test sensed information units; wherein the representations may be indicative of features of the test sensed information units; finding a set of decorrelated elements, wherein the decorrelated elements may be selected out of (i) representations of the test sensed information units, and (ii) cluster identifiers that identify clusters of the representations of the test sensed information units; mapping each decorrelated element of the set to a unique combination of one or more object identifier; and associating different unique combinations to the spanning element of the signature generator.

The finding of the set of decorrelated elements may be executed in an iterative manner, one subset of decorrelated elements after the other.

The finding of the set of decorrelated elements may be executed in an iterative manner, one decorrelated element after the other.

The representations of the test sensed information units may be signatures generated by the signature generator.

The representations of the test sensed information units differ from signatures generated by the signature generator.

The associating may include gradually associating the different unique combinations to all spanning elements.

The method may include configuring the spanning elements based on a frequency of appearance of patterns in the test images.

The method may include assigning identifiers of a same object to a same spanning element.

The method may include searching for candidate decorrelated elements in a random manner and finding, out of candidate decorrelated elements, the set of decorrelated elements.

Each cluster of the representations may be of at least a minimal predefined size and wherein a number of clusters of the representations may be limited to a maximal predefined number.

The decorrelated elements may be the cluster identifiers and wherein the mapping may include mapping each decorrelated cluster identifier to set to a unique combination of one or more object identifiers, wherein at least one unique combination differs from a signature by number of object identifiers.

There may be provided a method for generating a signature of a sensed information unit, the method may include receiving or generating a sensed information unit; and calculating the signature of the sensed information unit by performing multiple iterations, wherein each iteration of at least some of the multiple iterations may include applying, by spanning elements related to the iteration, a dimension expansion process that may be followed by a merge operation. The spanning elements related to the multiple iterations may be configured by receiving test sensed information units; generating representations of the test sensed information units; wherein the representations may be indicative of features of the test sensed information units; finding a set of decorrelated elements, wherein the decorrelated elements may be selected out of (i) representations of the test sensed information units, and (ii) cluster identifiers that identify clusters of the representations of the test sensed information units; mapping each decorrelated element of the set to a unique combination of one or more object identifier; and associating different unique combinations to the spanning element of the signature generator.

There may be provided a non-transitory computer readable medium for configuring spanning elements of a signature generator, the non-transitory computer readable medium stores instructions for receiving test sensed information units; generating representations of the test sensed information units; wherein the representations may be indicative of features of the test sensed information units; finding a set of decorrelated elements, wherein the decorrelated elements may be selected out of (i) representations of the test sensed information units, and (ii) cluster identifiers that identify clusters of the representations of the test sensed information units; mapping each decorrelated element of the set to a unique combination of one or more object identifier; and associating different unique combinations to the spanning element of the signature generator.

The finding of the set of decorrelated elements may be executed in an iterative manner, one subset of decorrelated elements after the other.

The finding of the set of decorrelated elements may be executed in an iterative manner, one decorrelated element after the other.

The representations of the test sensed information units may be signatures generated by the signature generator.

The representations of the test sensed information units differ from signatures generated by the signature generator.

The associating may include gradually associating the different unique combinations to all spanning elements.

The non-transitory computer readable medium that stores instructions for configuring the spanning elements based on a frequency of appearance of patterns in the test images.

The non-transitory computer readable medium that stores instructions for assigning identifiers of a same object to a same spanning element.

The searching for candidate decorrelated elements may be executed in a random manner and may be followed by finding, out of candidate decorrelated elements, the set of decorrelated elements.

Each cluster of the representations may be of at least a minimal predefined size and wherein a number of clusters of the representations may be limited to a maximal predefined number.

The decorrelated elements may be the cluster identifiers and wherein the mapping may include mapping each decorrelated cluster identifier to set to a unique combination of one or more object identifiers, wherein at least one unique combination differs from a signature by number of object identifiers.

BRIEF DESCRIPTION OF THE DRAWINGS

The embodiments of the disclosure will be understood and appreciated more fully from the following detailed description, taken in conjunction with the drawings in which.

DESCRIPTION OF EXAMPLE EMBODIMENTS

Figure 1:
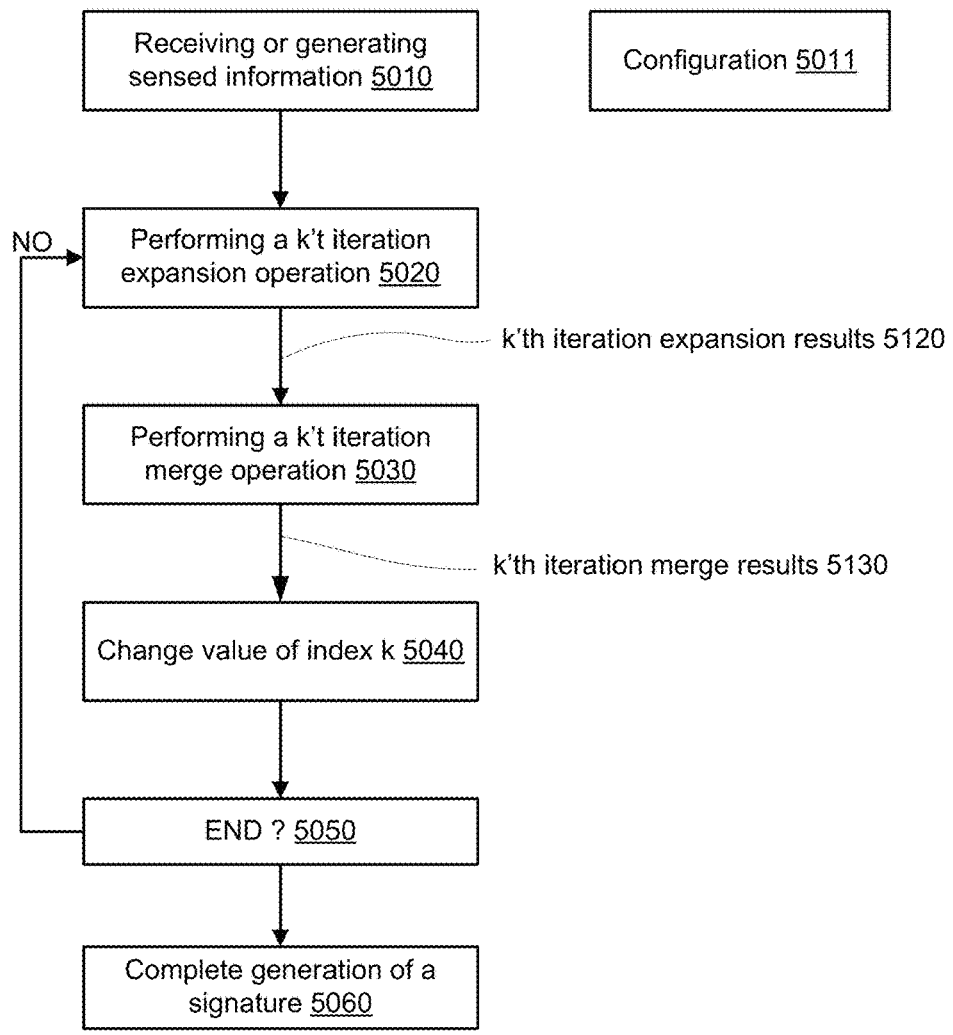
FIG. 1 illustrates an example of a method.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method and/or to a non-transitory computer readable medium that stores instructions for executing the method.

Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

Any combination of any module or unit listed in any of the figures, any part of the specification and/or any claims may be provided.

The specification and/or drawings may refer to an image. An image is an example of a media unit. Any reference to an image may be applied mutatis mutandis to a media unit. A media unit may be an example of sensed information unit. Any reference to a media unit may be applied mutatis mutandis to sensed information. The sensed information may be sensed by any type of sensors—such as a visual light camera, or a sensor that may sense infrared, radar imagery, ultrasound, electro-optics, radiography, LIDAR (light detection and ranging), etc.

The specification and/or drawings may refer to a processor. The processor may be a processing circuitry. The processing circuitry may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

Any combination of any steps of any method illustrated in the specification and/or drawings may be provided.

Any combination of any subject matter of any of claims may be provided.

Any combinations of systems, units, components, processors, sensors, illustrated in the specification and/or drawings may be provided.

The analysis of content of a media unit may be executed by generating a signature of the media unit and by comparing the signature to reference signatures. The reference signatures may be arranged in one or more concept structures or may be arranged in any other manner. The signatures may be used for object detection or for any other use.

The signature may be generated by creating a multidimensional representation of the media unit. The multidimensional representation of the media unit may have a very large number of dimensions. The high number of dimensions may guarantee that the multidimensional representation of different media units that include different objects is sparse—and that object identifiers of different objects are distant from each other—thus improving the robustness of the signatures.

The generation of the signature is executed in an iterative manner that includes multiple iterations, each iteration may include an expansion operations that is followed by a merge operation. The expansion operation of an iteration is performed by spanning elements of that iteration.

FIG. 1 illustrates a method 5000 for generating a signature of a media unit.

Method 5000 may start by step S010 of receiving or generating sensed information.

The sensed information may be a media unit of multiple objects.

Step S010 may be followed by processing the media unit by performing multiple iterations, wherein at least some of the multiple iterations comprises applying, by spanning elements of the iteration, dimension expansion process that are followed by a merge operation.

The processing may include:

Step S020 of performing a k'th iteration expansion process (k may be a variable that is used to track the number of iterations).

Step S030 of performing a k'th iteration merge process.

Step S040 of changing the value of k.

Step S050 of checking if all required iterations were done—if so proceeding to step S060 of completing the generation of the signature. Else—jumping to step S020.

The output of step S020 is a k'th iteration expansion results 5120.

The output of step S030 is a k'th iteration merge results 5130.

For each iteration (except the first iteration)—the merge result of the previous iteration is an input to the current iteration expansion process.

The method may include step S011 of configuring the spanning elements. Step S011 may include, for example, the steps of method 9400 of FIG. 5. Alternatively—step S020 may be executed by spanning elements that are configured according to method 9400.

Figure 2:
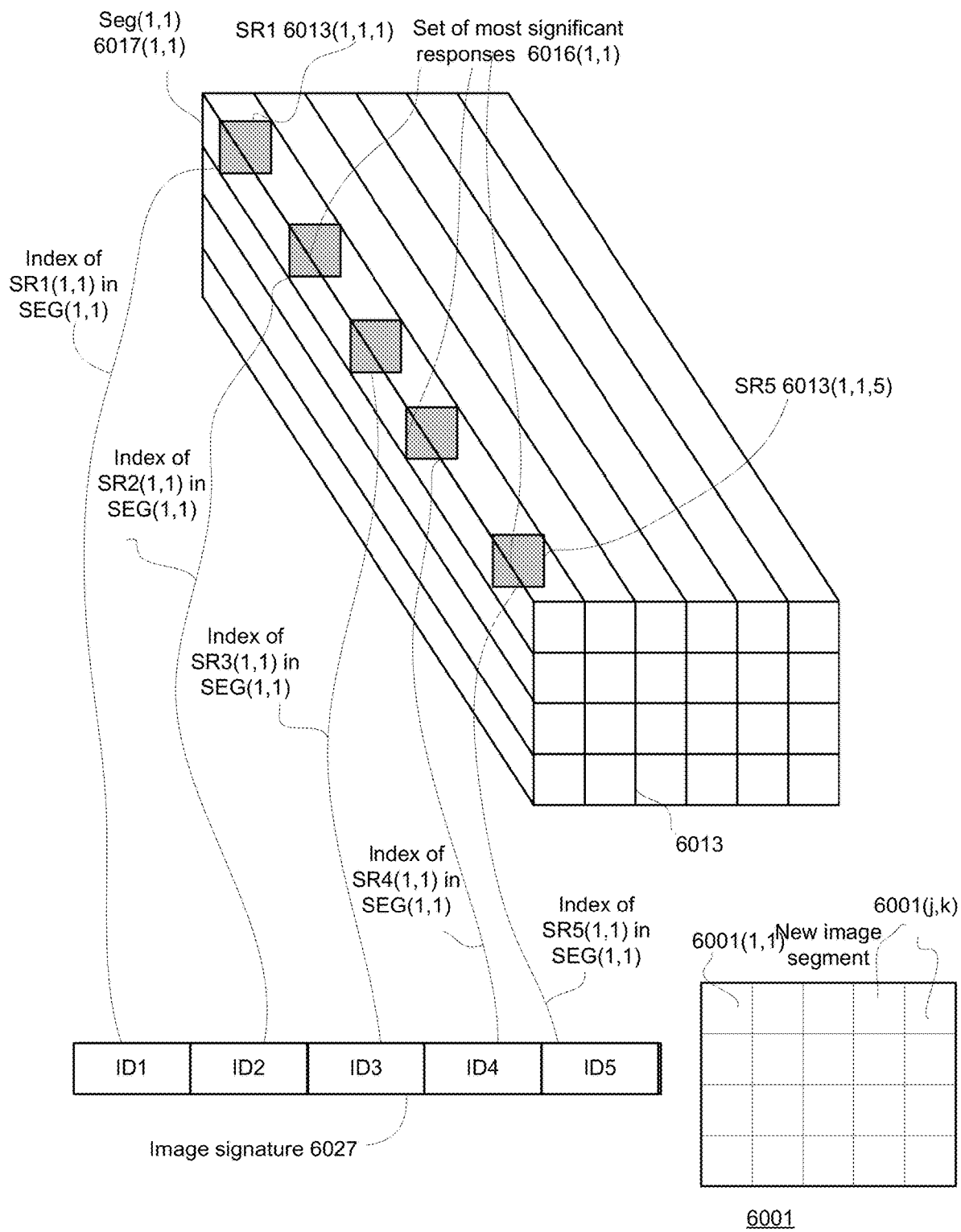
FIG. 2 illustrates an example of a signature.
Figure 3:
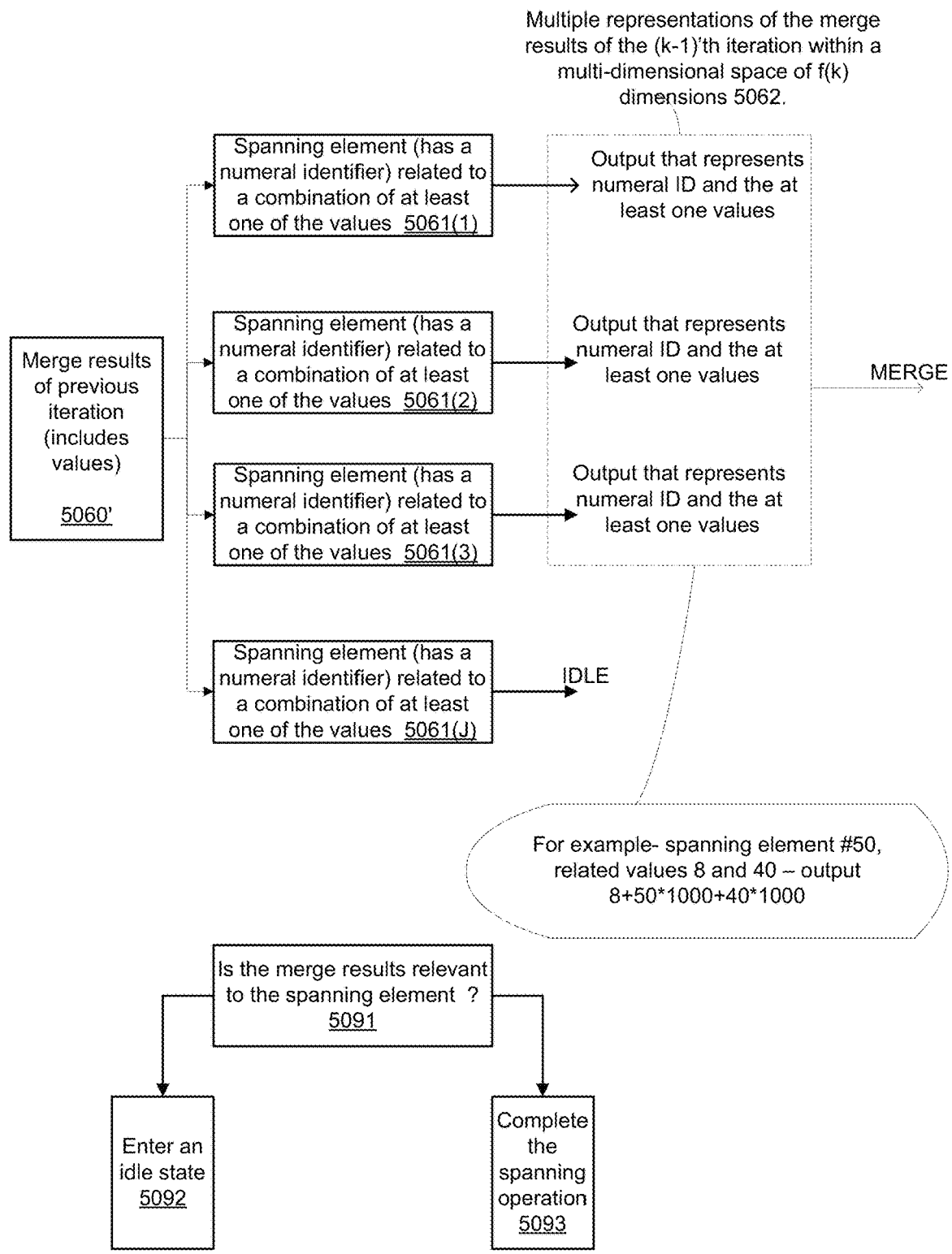
FIG. 3 illustrates an example of a dimension expansion process.

FIG. 2 is an example of a signature 6027 of a media unit that is an image 6000 and of an outcome 6013 of the last (K'th) iteration.

The image 6001 is virtually segments to segments 6000 (i,k). The segments may be of the same shape and size but this is not necessarily so.

Outcome 6013 may be a tensor that includes a vector of values per each segment of the media unit. One or more objects may appear in a certain segment. For each object—an object identifier (of the signature) points to locations of significant values, within a certain vector associated with the certain segment.

For example—a top left segment (6001(1,1)) of the image may be represented in the outcome 6013 by a vector V(1,1) 6017(1,1) that has multiple values. The number of values per vector may exceed 100, 200, 500, 1000, and the like.

The significant values (for example—more than 10, 20, 30, 40 values, and/or more than 0.1%, 0.2%, 0.5%, 1%, 5% of all values of the vector and the like) may be selected. The significant values may have the values—but may be selected in any other manner.

FIG. 2 illustrates a set of significant responses 6015(1,1) of vector V(1,1) 6017(1,1). The set includes five significant values (such as first significant value SV1(1,1) 6013(1,1,1), second significant value SV2(1,1), third significant value SV3(1,1), fourth significant value SV4(1,1), and fifth significant value SV5(1,1) 6013(1,1,5)).

The image signature 6027 includes five indexes for the retrieval of the five significant values—first till fifth identifiers ID1-ID5 are indexes for retrieving the first till fifth significant values.

Figure 4:
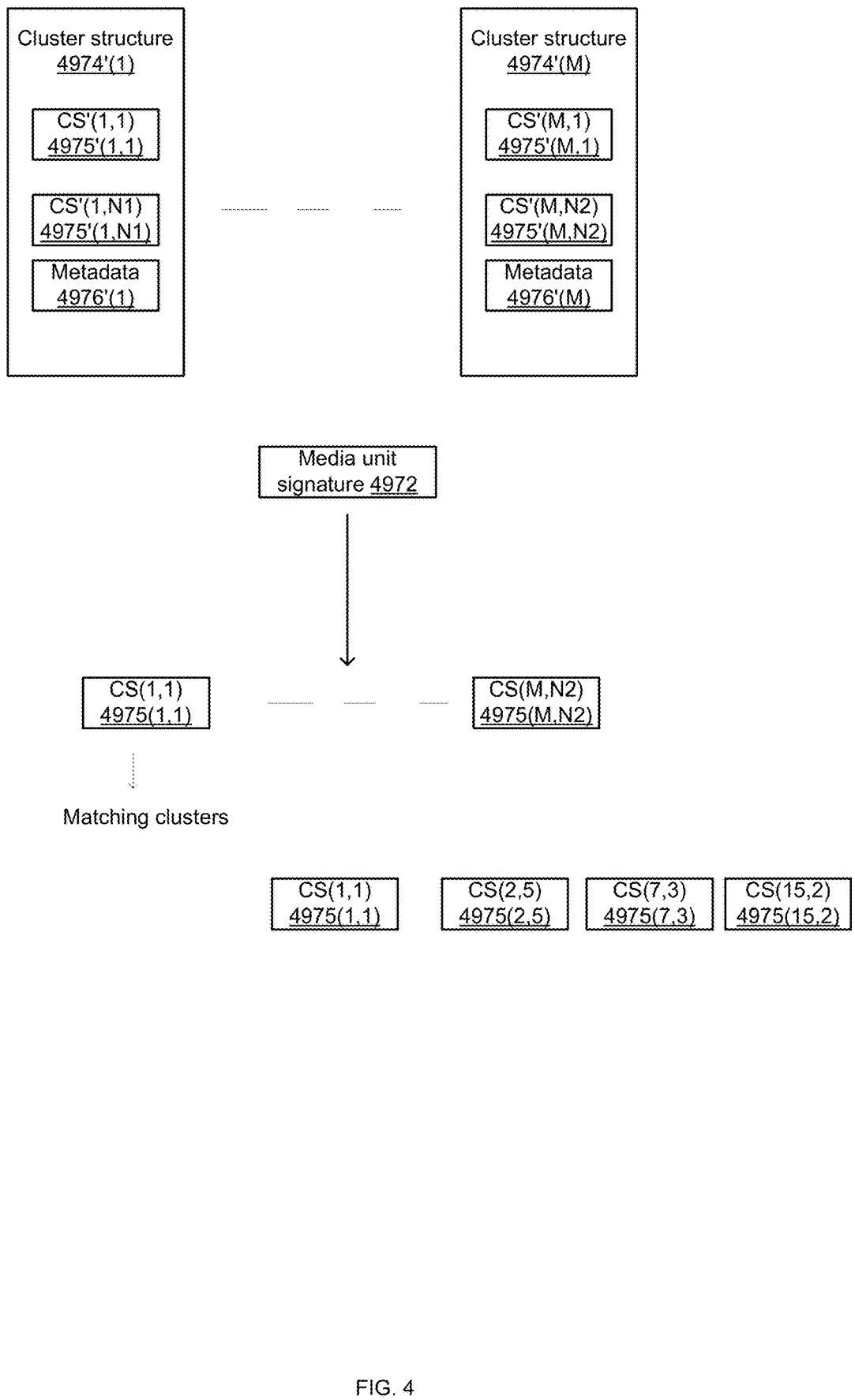
FIG. 4 illustrates an example of a clusters of a signatures matching process.

FIG. 4 illustrates an example of a clusters of a signatures matching process.

It is assumed that there are multiple (M) cluster structures 4974(1)-4974(M). Each cluster structure includes cluster signatures, metadata regarding the cluster signatures.

For example—first cluster structure 4974(1) includes multiple (N1) signatures (referred to as cluster signatures CS) CS(1,1)-CS(1,N1) 4975(1,1)-4975(1,N 1) and metadata 4976(1).

Yet for another example—M'th cluster structure 4974(M) includes multiple (N2) signatures (referred to as cluster signatures CS) CS(M,1)-CS(M,N2) 4975(M,1)-4975(M,N2) and metadata 4976(M).

FIG. 4 also illustrates a media unit signature 4972 that is compared to the signatures of the M cluster structures—from CS(1,1) 4975(1,1) till CS(M,N2) 4975(M,N2).

We assume that one or more cluster structures are matching cluster structures.

Once the matching cluster structures are found the method proceeds by generating shape information that is of higher accuracy then the compressed shape information.

For example—assuming that the matching signatures include CS(1,1) 2975(1,1), CS(2,5) 2975(2,5), CS(7,3) 2975(7,3) and CS(15,2) 2975(15,2).

The number of signatures per concept structure may change over time—for example due to cluster reduction attempts during which a CS is removed from the structure to provide a reduced cluster structure, the reduced structure structure is checked to determine that the reduced cluster signature may still identify objects that were associated with the (non-reduced) cluster signature—and if so the signature may be reduced from the cluster signature.

The signatures of each cluster structures are associated to each other, wherein the association may be based on similarity of signatures and/or based on association between metadata of the signatures.

Assuming that each cluster structure is associated with a unique object—then objects of a media unit may be identified by finding cluster structures that are associated with said objects. The finding of the matching cluster structures may include comparing a signature of the media unit to signatures of the cluster structures- and searching for one or more matching signature out of the cluster signatures.

Each cluster may be identified by a cluster identifier. The cluster identifier may differ by size (for example by number of object identifiers) than a signature. One or more cluster identifiers may identify the cluster. A cluster identifier may include identifiers that are shared between CSs, may include identifiers that appear (even if not shared) in a CS, and the like. The cluster identifier may be generated by applying any function on the CS of a cluster.

For example—assuming that a cluster identifier include identifiers that are shared between two or more CS of the cluster. If no identifier is shared between all CS of the cluster—then multiple cluster identifier may be required to represent a single cluster. The cluster identifier may include all (or at least some) of the signature that appear in one or more CSs.

Figure 5:
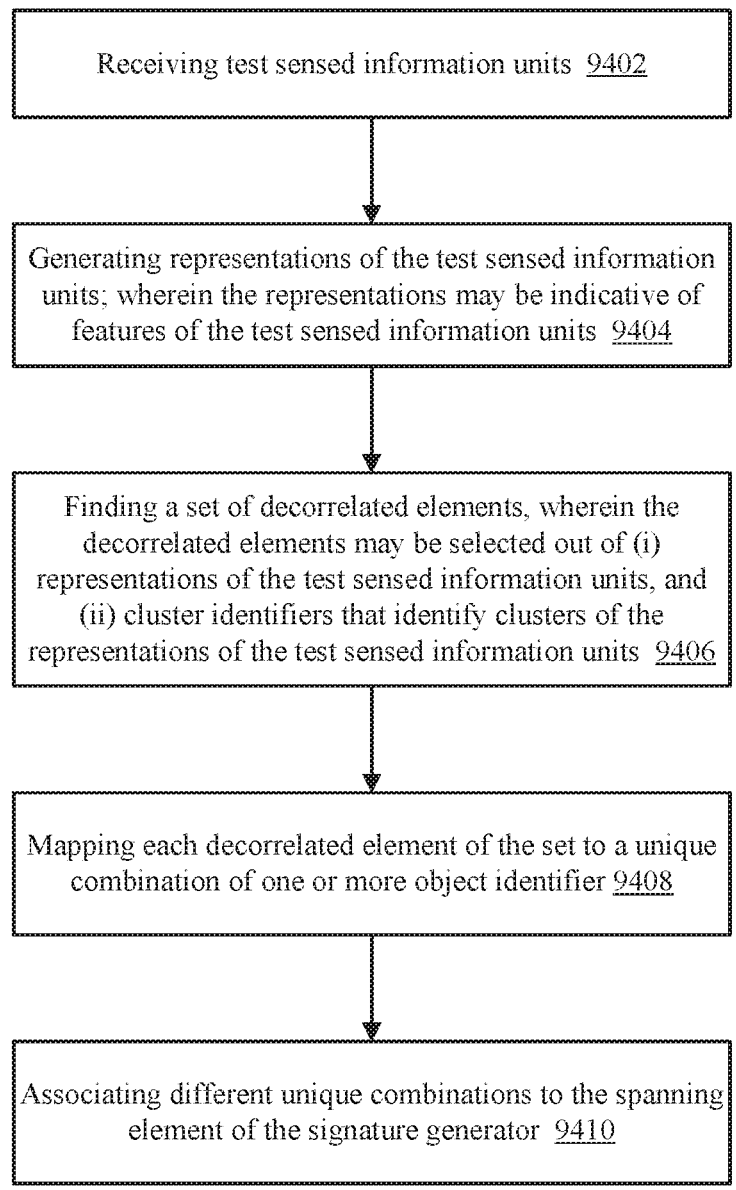
FIG. 5 illustrates a method.

FIG. 5 illustrates a method 9400 for configuring spanning elements of a signature generator.

Method 9400 may include the following steps:

Receiving test sensed information units 9402.

Generating representations of the test sensed information units. The representations may be indicative of features of the test sensed information units 9404. The representations may be calculated in any manner that guarantees that at least some features of the objects are included in the representations. The representations may be tensors that assign multiple features to segments of the test sensed information units. The features may be any mathematical and/or physical features.

Finding a set of decorrelated elements, wherein the decorrelated elements may be selected out of (i) representations of the test sensed information units, and (ii) cluster identifiers that identify clusters of the representations of the test sensed information units 9406.

Mapping each decorrelated element of the set to a unique combination of one or more object identifier 9408. The mapping Associating different unique combinations to the spanning element of the signature generator 9410.

Figure 8:
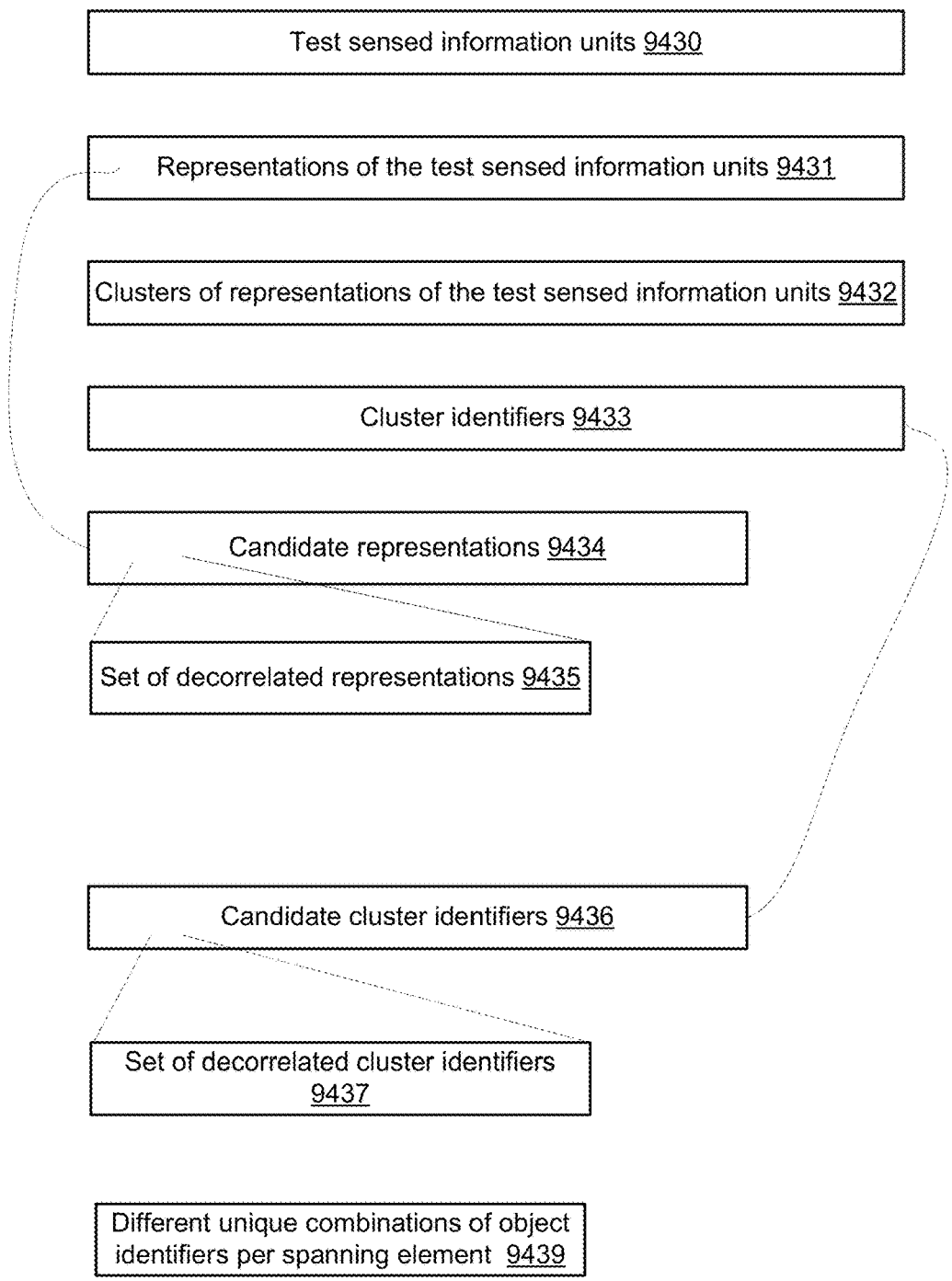
FIG. 8 illustrates various data structures.

Various data elements referred to in FIG. 5 are illustrated in FIG. 8.

Each spanning element may be configured to determine whether it is relevant to a signature generation process based on the unique combination of one or more object identifiers that are associated with the spanning element. Thus—when a spanning element receives as input (for example as a result of a previous merge iteration) the unique combination (either alone or on addition to other signatures)—spanning element is relevant and completes the expansion process. If a spanning element does not receive (at least) the unique combination—the spanning element does not output a expansion result.

Step 9406 of finding of the set of decorrelated elements may be executed in an iterative manner, one subset of decorrelated elements after the other.

Step 9406 of finding of the set of decorrelated elements may be executed in an iterative manner, one decorrelated element after the other.

The representations (generated during step 9404) of the test sensed information units may be signatures generated by the signature generator or may differ from signatures generated by the signature generator.

Step 9410 of associating may include gradually associating the different unique combinations to all spanning elements.

It has been found that method 9400 inherently configures the spanning elements based on a frequency of appearance of patterns in the test test sensed information units.

Step 9410 may include or may be followed by verifying that identifiers of a same object are assigned to a same spanning element. If not the association may be amended.

Step 9406 may include searching for candidate decorrelated elements in a random manner and finding, out of candidate decorrelated elements, the set of decorrelated elements.

Regarding step 9406—each cluster of the representations may be of at least a minimal predefined size and wherein a number of clusters of the representations may be limited to a maximal predefined number.

The decorrelated elements may be the cluster identifiers and step 9410 may include mapping each decorrelated cluster identifier to set to a unique combination of one or more object identifiers. The at least one unique combination may differs from a signature by number of object identifiers. Alternatively, the at least one unique combination may have a same number of identifiers as a signature.

Figure 6:
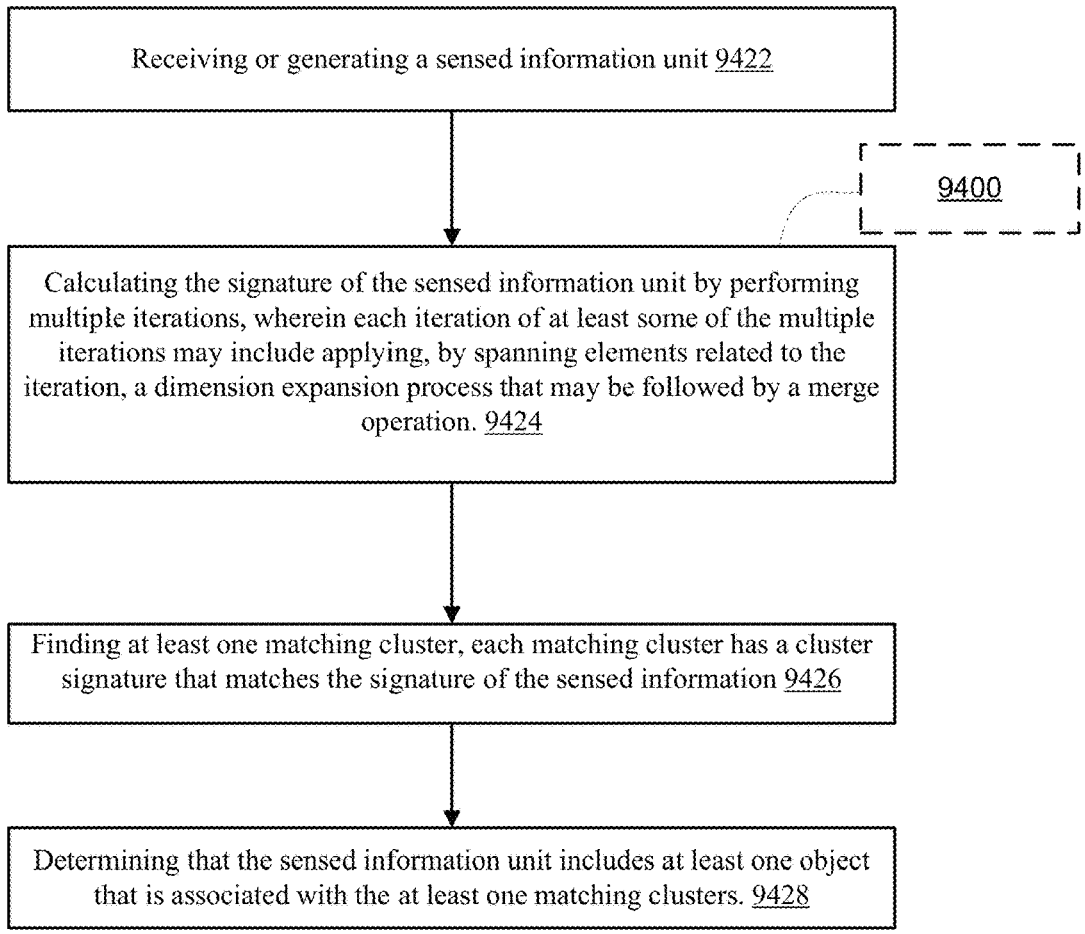
FIG. 6 illustrates a method.

FIG. 6 illustrates method 9420 of generating a signature of a sensed information unit.

Method 9420 may include the following steps:

Receiving or generating a sensed information unit 9422.

Calculating the signature of the sensed information unit by performing multiple iterations, wherein each iteration of at least some of the multiple iterations may include applying, by spanning elements related to the iteration, a dimension expansion process that may be followed by a merge operation. 9424

The spanning elements may be configured by executing method 9400.

Method 9420 may also include:

Finding at least one matching cluster, each matching cluster has a cluster signature that matches the signature of the sensed information 9426.

Determining that the sensed information unit includes at least one object that is associated with the at least one matching clusters 9428.

Figure 7:
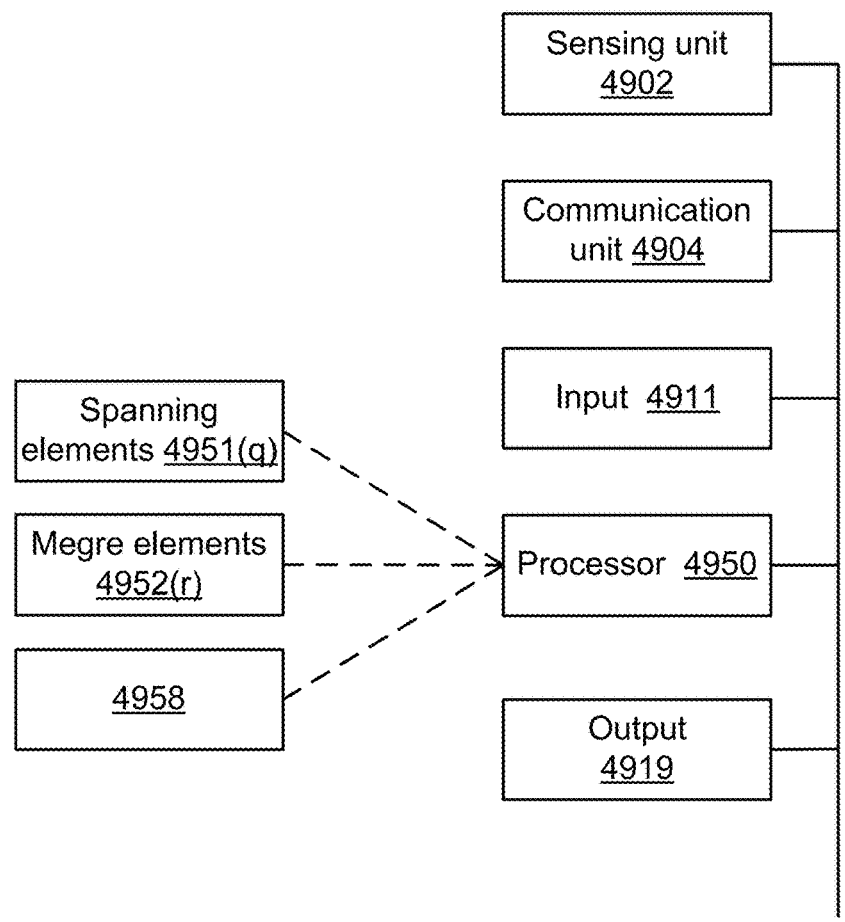
FIG. 7 illustrates a system.

FIG. 7 illustrates an example of a system capable of executing one or more of the mentioned above methods.

The system include various components, elements and/or units.

A component element and/or unit may be a processing circuitry may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

Alternatively, each component element and/or unit may implemented in hardware, firmware, or software that may be executed by a processing circuitry.

System 4900 may include sensing unit 4902, communication unit 4904, input 4911, processor 4950, and output 4919. The communication unit 4904 may include the input and/or the output.

Input and/or output may be any suitable communications component such as a network interface card, universal serial bus (USB) port, disk reader, modem or transceiver that may be operative to use protocols such as are known in the art to communicate either directly, or indirectly, with other elements of the system.

Processor 4950 may include at least some out of

Multiple spanning elements 4951($q$).

Multiple merge elements 4952($r$).

Signature generator 4958.

FIG. 8 illustrates various data structures such as:

Test sensed information units 9430.

Representations 9431 of the test sensed information units.

Clusters 9432 of the representations 9431 of the test sensed information units.

Cluster identifiers 9433 that identify clusters 9432.

Candidate representations 9434 (may be selected out of representations 9431). They may be generated during step 9406.

Set of decorrelated representations 9435. They may be generated during step 9406.

Candidate cluster identifiers 9436 (may be selected out of cluster identifiers 9433). They may be generated during step 9406.

Set of decorrelated cluster identifiers 9437. They may be generated during step 9406.

The spanning elements (routers) should represent an information space (may be a large information space of all possible variations of sensed information or a part of that space) in a satisfactory manner.

This may be obtained by fulfilling at least one of the requirements:

Spanning elements should be de-correlated and spanning element set should cover the information space well, i.e. descriptors of different objects go through different spanning elements and all common patterns have a representation in the spanning element set.

However, we would not want spanning elements to split encapsulated information: spanning elements should be repeatable, i.e. descriptors of the same object should go through the same spanning element. We would not like over-representation Spanning element usage should represent frequency of data patterns. i.e. spanning elements need not be symmetric in terms of their usage: some spanning elements represent objects which are very common, e.g. sky whilst other represent rarer objects, e.g. hands.

There may be provided several methods to attain a spanning element set which addresses the said design considerations.

Minimize Mutual Match Score
Parameters:
SPANNING ELEMENT_SET_SIZE
MIN_MATCH_SCORE
Method:
Choose a data set which represents the world.
Begin with an empty spanning element set R
Randomly iterate over descriptors while |R|<SPANNING ELEMENT_SET_SIZE
If a descriptor's maximal match score with all spanning elements in set is <MIN_MATCH_SCORE
Then add it to the set
Advantages:
enforces low match score—keeps spanning elements de-correlated by
keeps spanning element set size fixed and relatively small—avoids over-representation
Iterates through descriptors randomly—sustains the natural frequency of the information
Corresponds with a top-k spanning element matching during spanning: match score makes a difference
Infer Meta-Spanning Elements Through Information Frequency
Parameters:
SPANNING ELEMENT_SET_SIZE
MIN_CLUSTER_SIZE=2
Algorithm:
Choose a data set which represents the world
Cluster into SPANNING ELEMENT_SET_SIZE clusters, each with
size >=MIN_CLUSTER_SIZE
using a standard clustering algorithm which optimizes inter-cluster distance vs intra-cluster distance
  i. Construct meta-descriptor from each cluster by choosing intersection of all cluster descriptor.
  ii. Set a threshold for each meta-descriptor such that descriptors from other clusters do not match.
It should be noted that
high inter-cluster distances encourage de-correlated spanning element sets
low intra-cluster distances and matching thresholds encourage repeatability
cluster size predicts usage—this algorithm allows clusters of any size >1
This method corresponds with an above-the-threshold matching during spanning: threshold makes a difference While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

We claim:

1. A method for configuring spanning elements of a signature generator, the method comprises:
   receiving test sensed information units;
   generating representations of the test sensed information units; wherein the representations are indicative of features of the test sensed information units;
   finding a set of decorrelated elements, wherein the decorrelated elements are cluster identifiers that identify clusters of the representations of the test sensed information units;
   mapping each decorrelated element of the set to a unique combination of one or more object identifier; wherein the mapping comprises mapping each decorrelated cluster identifier of the set to a unique combination of one or more object identifiers, wherein at least one unique combination differs from a signature by number of object identifiers; and
   associating different unique combinations to different spanning elements of the signature generator.

2. The method according to claim 1 wherein the finding of the set of decorrelated elements is executed in an iterative manner, one subset of decorrelated elements after the other.

3. The method according to claim 1 wherein the finding of the set of decorrelated elements is executed in an iterative manner, one decorrelated element after the other.

4. The method according to claim 1 wherein the representations of the test sensed information units are signatures generated by the signature generator.

5. The method according to claim 1 wherein the representations of the test sensed information units differ from signatures generated by the signature generator.

6. The method according to claim 1 wherein the associating comprises gradually associating the different unique combinations to all spanning elements.

7. The method according to claim 1 comprising configuring the spanning elements based on a frequency of appearance of patterns in the test sensed information units.

8. The method according to claim 1 comprising searching for candidate decorrelated elements in a random manner and finding, out of candidate decorrelated elements, the set of decorrelated elements.

9. The method according to claim 1 wherein each clusters of the representations is of at least a minimal predefined size and wherein a number of clusters of the representations is limited to a maximal predefined number.

10. A method for configuring spanning elements of a signature generator, the method comprises:
    receiving test sensed information units;
    generating representations of the test sensed information units; wherein the representations are indicative of features of the test sensed information units;
    finding a set of decorrelated elements, wherein the decorrelated elements are selected out of (i) representations of the test sensed information units, and (ii) cluster identifiers that identify clusters of the representations of the test sensed information units;
    mapping each decorrelated element of the set to a unique combination of one or more object identifier; and
    associating different unique combinations to different spanning element of the signature generator; wherein the method comprises assigning identifiers of a same object to a same spanning element.

11. The method according to claim 10 wherein the decorrelated elements are the cluster identifiers and wherein the mapping comprises mapping each decorrelated cluster identifier to set to a unique combination of one or more object identifiers, wherein at least one unique combination differs from a signature by number of object identifiers.

12. A method for generating a signature of a sensed information unit, the method comprises: receiving or generating a sensed information unit;
    and calculating the signature of the sensed information unit by performing multiple iterations, wherein each iteration of at least some of the multiple iterations comprises applying, by spanning elements related to the iteration, a dimension expansion process that is followed by a merge operation;
    wherein spanning elements related to the multiple iterations are configured by: receiving test sensed information units; generating representations of the test sensed information units; wherein the representations are indicative of features of the test sensed information units; finding a set of decorrelated elements, wherein the decorrelated elements are selected out of (i) representations of the test sensed information units, and (ii) cluster identifiers that identify clusters of the representations of the test sensed information units; mapping each decorrelated element of the set to a unique combination of one or more object identifier; and associating different unique combinations to different spanning elements of the signature generator.

13. A non-transitory computer readable medium for configuring spanning elements of a signature generator, the non-transitory computer readable medium stores instructions for: receiving test sensed information units; generating representations of the test sensed information units; wherein the representations are indicative of features of the test sensed information units; finding a set of decorrelated elements, wherein the decorrelated elements are cluster identifiers that identify clusters of the representations of the test sensed information units; mapping each decorrelated element of the set to a unique combination of one or more object identifier; wherein the mapping comprises mapping each decorrelated cluster identifier of the set to a unique combination of one or more object identifiers, wherein at least one unique combination differs from a signature by number of object identifiers; and associating different unique combinations to different spanning elements of the signature generator.

14. The non-transitory computer readable medium according to claim 13 wherein the finding of the set of decorrelated elements is executed in an iterative manner, one subset of decorrelated elements after the other.

15. The non-transitory computer readable medium according to claim 13 wherein the finding of the set of decorrelated elements is executed in an iterative manner, one decorrelated element after the other.

16. The non-transitory computer readable medium according to claim 13 wherein the representations of the test sensed information units are signatures generated by the signature generator.

17. The non-transitory computer readable medium according to claim 13 wherein the representations of the test sensed information units differ from signatures generated by the signature generator.

18. The non-transitory computer readable medium according to claim 13 wherein the associating comprises gradually associating the different unique combinations to all spanning elements.

19. The non-transitory computer readable medium according to claim 13 that stores instructions for configuring the spanning elements based on a frequency of appearance of patterns in the test sensed information units.

20. The non-transitory computer readable medium according to claim 13 that stores instructions for assigning identifiers of a same object to a same spanning element.

21. The non-transitory computer readable medium according to claim 13 that stores instructions for searching for candidate decorrelated elements in a random manner and finding, out of candidate decorrelated elements, the set of decorrelated elements.

22. The non-transitory computer readable medium according to claim 13 wherein each clusters of the representations is of at least a minimal predefined size and wherein a number of clusters of the representations is limited to a maximal predefined number.

* * * * *